(12) United States Patent
Ikeda et al.

(10) Patent No.: US 7,307,885 B2
(45) Date of Patent: Dec. 11, 2007

(54) MULTI-VALUE NONVOLATILE SEMICONDUCTOR MEMORY DEVICE EQUIPPED WITH REFERENCE CELL AND LOAD BALANCING CIRCUIT

(75) Inventors: Toshimi Ikeda, Kawasaki (JP); Atsushi Hatakeyama, Kawasaki (JP); Nobutaka Taniguchi, Kawasaki (JP); Akira Kikutake, Kawasaki (JP); Kuninori Kawabata, Kawasaki (JP); Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/063,999

(22) Filed: Feb. 24, 2005

(65) Prior Publication Data

US 2005/0162955 A1 Jul. 28, 2005

Related U.S. Application Data

(63) Continuation of application No. PCT/JP03/02514, filed on Mar. 4, 2003.

(51) Int. Cl.
*G11C 16/28* (2006.01)

(52) U.S. Cl. ............... 365/185.21; 365/185.2; 365/185.03; 365/185.13; 365/185.11

(58) Field of Classification Search ........... 365/185.03, 365/185.13, 185.11, 185.21, 185.2
See application file for complete search history.

(56) References Cited

U.S. PATENT DOCUMENTS

| | | | |
|---|---|---|---|
| 5,822,248 A | 10/1998 | Satori et al. | 365/185.21 |
| 6,016,276 A | 1/2000 | Fuji | 365/189.07 |
| 6,370,060 B2* | 4/2002 | Takata et al. | 365/185.21 |
| 6,515,906 B2* | 2/2003 | Tedrow et al. | 365/185.21 |
| 6,816,398 B2* | 11/2004 | Sakai et al. | 365/145 |
| 6,885,250 B1* | 4/2005 | Le et al. | 330/311 |
| 6,912,160 B2* | 6/2005 | Yamada | 365/185.2 |
| 6,992,931 B2* | 1/2006 | Pekny | 365/185.2 |

FOREIGN PATENT DOCUMENTS

| | | |
|---|---|---|
| JP | 8-203291 A | 8/1996 |
| JP | 09-198886 A | 7/1997 |
| JP | 11-016379 | 1/1999 |
| JP | 11306771 A | 11/1999 |
| JP | 2000-184190 A | 6/2000 |

(Continued)

OTHER PUBLICATIONS

English translation of JP-2002 008386, published Jan. 11, 2002, 127 pages.*

*Primary Examiner*—Andrew Q. Tran
(74) *Attorney, Agent, or Firm*—Arent Fox, LLP (57) ABSTRACT

A nonvolatile semiconductor memory device includes a plurality of memory cells holding memory cell information, a plurality of bit lines connected to the plurality of memory cells, the plurality of bit lines including a first bit line conected to a selected one of the plurality of memory cells and a plurality of second bit lines connected to non-selected memory cells, a plurality of reference cells supplying different reference currents respectively, and a read-out circuit, wherein, when reading the memory cell information, the read-out circuit is coupled to the first bit line connected to the selected memory cell and coupled to one of the plurality of reference cells through one of the plurality of second bit lines connected to the non-selected memory cells.

18 Claims, 9 Drawing Sheets

FOREIGN PATENT DOCUMENTS

| | | |
|---|---|---|
| JP | 2000-222896 | 8/2000 |
| JP | 2001-307494 | 11/2001 |
| JP | 2001-344983 | 12/2001 |
| JP | 2002008386 A | 1/2002 |
| JP | 2003-077282 | 3/2003 |
| WO | WO 2004079746 A1 * | 9/2004 |

* cited by examiner

MULTI-VALUE NONVOLATILE SEMICONDUCTOR MEMORY DEVICE EQUIPPED WITH REFERENCE CELL AND LOAD BALANCING CIRCUIT

CROSS-REFERENCE TO RELATED APPLICATION

This application is a U.S. continuation application which is filed under 35 USC 111(a) and claims the benefit under 35 USC 120 and 365(c) of International Application No. PCT/JP2003/02514, filed on Mar. 4, 2003, the entire contents of which are hereby incorporated by reference.

BACKGROUND OF THE INVENTION

1. Field of the Invention

The present invention generally relates to a reading operation of reading memory cell information in a nonvolatile semiconductor memory device, and more particularly to a nonvolatile semiconductor memory device provided with a read-out circuit for reading multi-level information held in memory cells at high speed.

2. Description of the Related Art

In a nonvolatile semiconductor memory device, such as a flash memory, memory cell information is stored by using the current drive capacity of a nonvolatile transistor in a nonvolatile memory cell. That is, the memory cell information (i.e., data) of "1" or "0" is stored in the nonvolatile transistor depending on whether or not the nonvolatile transistor conducts current, or depending on whether the nonvolatile transistor conducts an increased current or a decreased current.

In recent years, a method of storing 2-bit data in one memory cell has been introduced in nonvolatile semiconductor memory devices, in order to increase recording density. In such a method, the potential held by one memory cell is divided into four states: "1", "2/3", "1/3", and "0".

For example, the information held by each memory cell is represented by the value of 2 bits in which the data "11", "10", "01", and "00" are assigned to the memory cell potentials "1", "2/3", "1/3", and "0", respectively.

Figure 1:
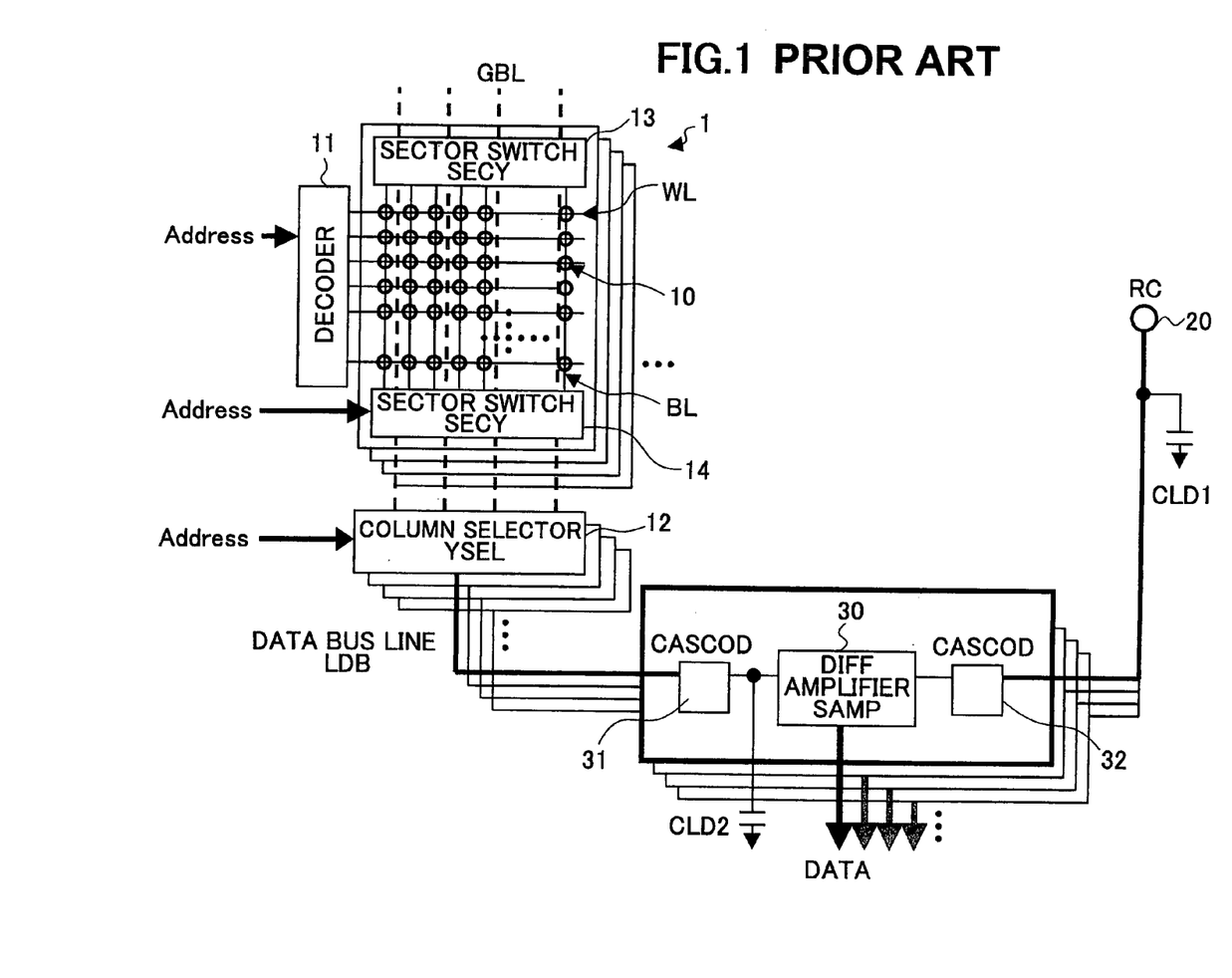
FIG. 1 is a schematic diagram showing the read-out circuit of a conventional nonvolatile semiconductor memory device in which each memory cell holds binary data.

FIG. 1 shows the composition of a conventional nonvolatile semiconductor memory device in which each memory cell holds binary data.

A memory core portion 1 includes a plurality of nonvolatile memory cells 10 (memory cell array), which are connected in a 2-dimensional matrix formation by word lines WL and bit lines BL, a decoder 11 to which an address signal is inputted, a column selector (YSEL) 12, a sector switch (SECY) 13, and a sector switch (SECY) 14.

In a nonvolatile semiconductor memory device, the read-out circuit (the sense circuit portion) compares a read-out current on a global bit line or a line connected to a selected memory cell, with a reference current from a reference cell to determine whether the data read is "1" or "0".

In the nonvolatile semiconductor memory device of FIG. 1, each memory cell 10 stores and holds binary data of "1" or "0". During a data read-out operation a level of a current IGBL flowing on a global bit line GBL, which is connected to a bit line BL of a memory cell 10 selected in accordance with an address signal (Address), is supplied to a first cascode circuit (CASCOD) 31 via a data bus line LDB. The cascode circuit 31 converts the received data read-out current IGBL into a voltage signal, and outputs the voltage signal to a first input of a differential amplifier (SAMP) 30.

A reference cell (RC) 20 is provided outside the memory core portion 1. The reference cell 20 is a memory cell for supplying a reference current IREF to the differential amplifier 30. The reference current IREF is set to an intermediate value between the current flowing through the global bit line GBL when the data held by the selected memory cell 10 is "1" and the current flowing through the global bit line GBL when the data held by the selected memory cell 10 is "0".

The reference current IREF from the reference cell (RC) 20 is supplied to a second cascode circuit (CASCOD) 32 via a reference bus line to which the reference cell (RC) 20 is connected. The cascode circuit 32 converts the received reference current IREF into a voltage signal, and outputs the voltage signal to a second input of the differential amplifier 30.

The differential amplifier 30 judges whether the data read-out of the selected memory cell 10 is a "1" or "0" by comparing the voltage level of the memory cell current IGBL at the time of the data read-out with the voltage level of the reference current IREF.

In the nonvolatile semiconductor memory device of FIG. 1, the global bit line GBL is connected with the plurality of bit lines BL of the memory core portion 1 through the sector switch 13. The nonvolatile semiconductor memory device has a hierarchical structure. The global bit line GBL is inputted into the column selector 12 for every predetermined number of bit lines. One of the bit lines is selected by the column selector 12, and the global bit line GBL is connected to the data bus line LDB by the selected bit line.

In the nonvolatile semiconductor memory device of FIG. 1, the memory cell 10 and the reference cell 20 are provided on opposite sides of the differential amplifier 30. An unbalance in capacity of parasitic elements in the sector switch 13, the sector switch 14 and the column selector 12 provided on the side of the memory core portion 1 iscorrected by a load capacitor CLD1 provided in the current path of the reference cell 20, and a load capacitor CLD2 provided between the cascode circuit 31 provided on the side of the memory cell 10 and the differential amplifier 30.

In a case of a nonvolatile semiconductor memory device in which each memory cell holds four-level data, during a read operation, a selected memory cell current at the time of the data read-out is compared with each of the three different reference-current values to determine a value of the read-out data. The three reference-current potential values are: the potential "3/4" which is the intermediate potential value of "1" and "2/3", the potential "1/2" which is the intermediate potential value of "2/3" and "1/3", and the potential "1/4" which is the intermediate potential value of "1/3" and "0".

Figure 2:
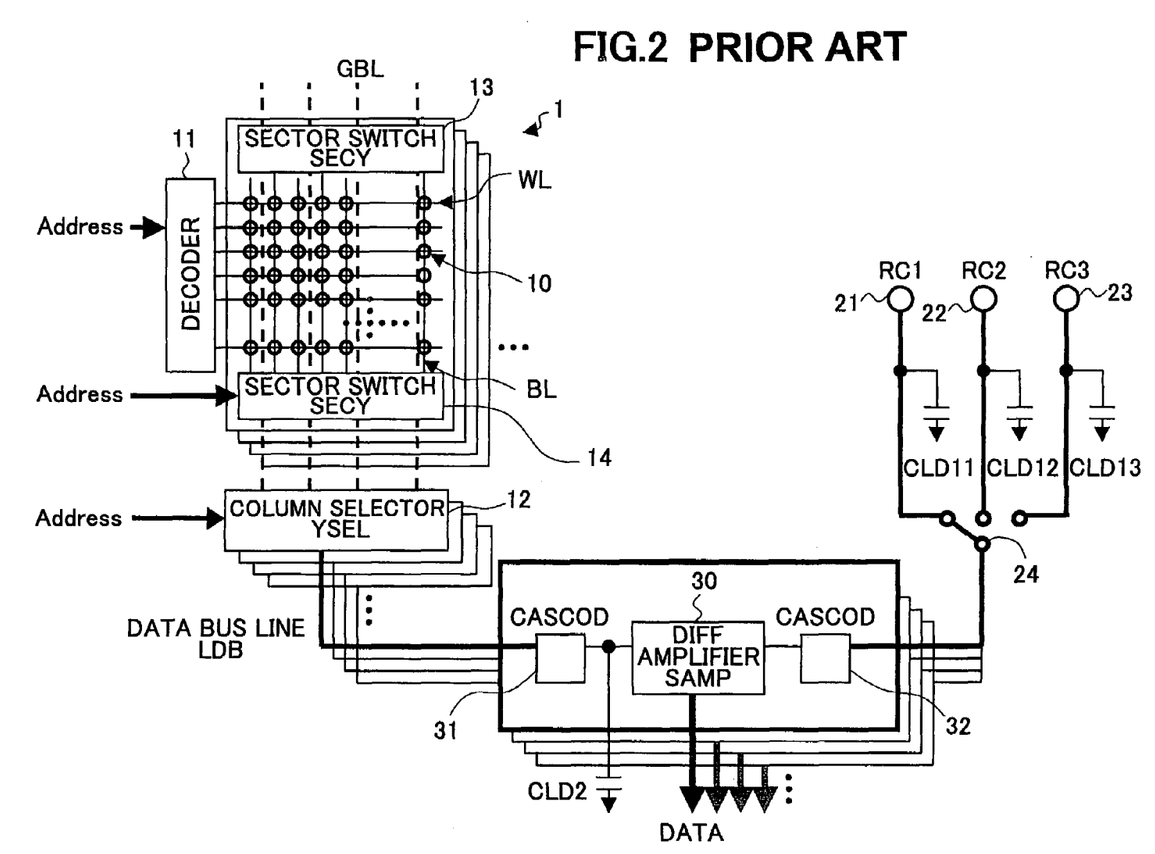
FIG. 2 is a schematic diagram showing the read-out circuit of a conventional nonvolatile semiconductor memory device in which each memory cell holds four-level data.
Figure 3:
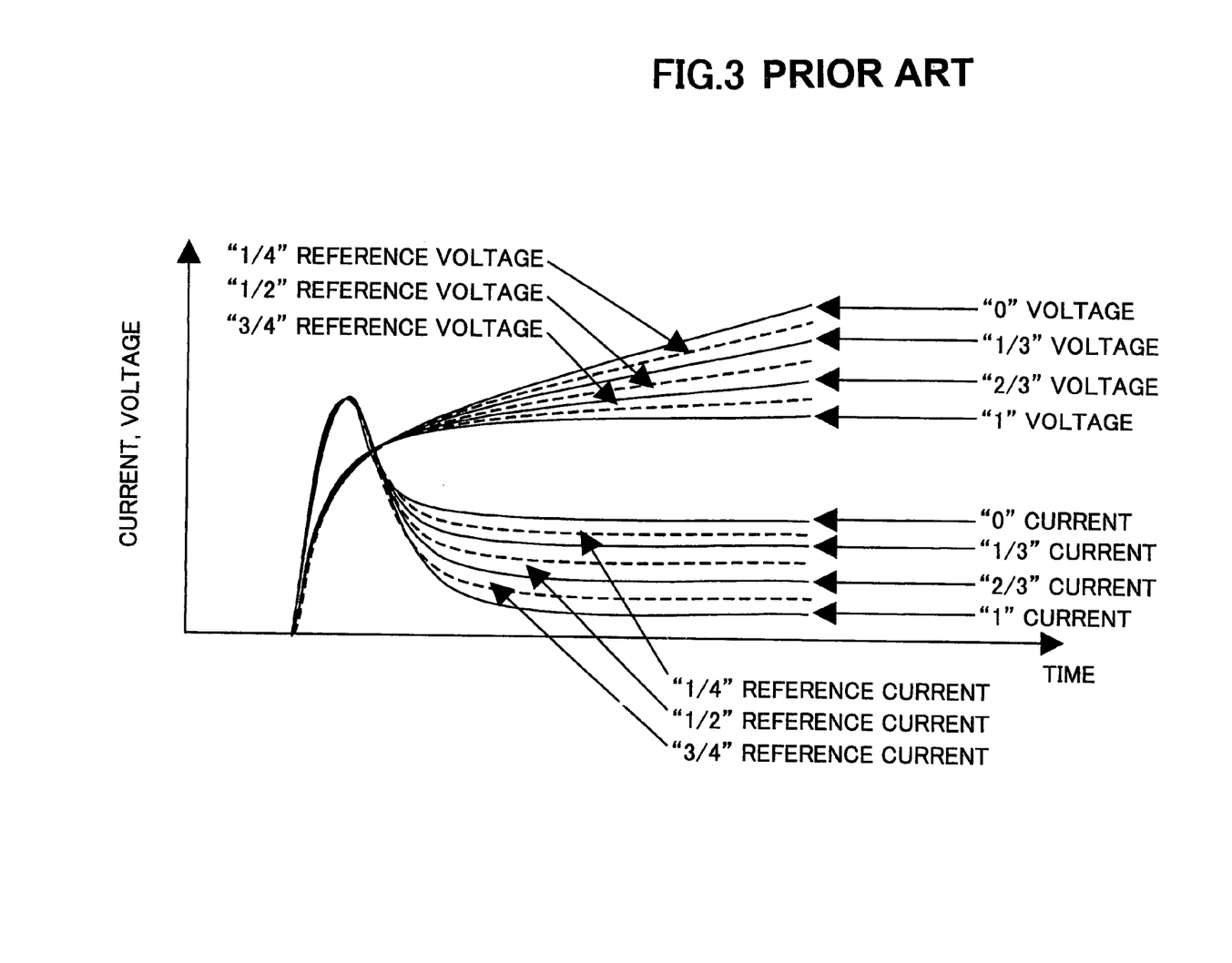
FIG. 3 is a waveform diagram for explaining operation of the data bus line at the time of a read-out operation in the nonvolatile semiconductor memory device of FIG. 2.

FIG. 2 shows the composition of conventional nonvolatile semiconductor memory device in which each memory cell holds four-level data. FIG. 3 is a waveform diagram for explaining operation of a data bus line at a time of a read-out operation in the nonvolatile semiconductor memory device of FIG. 2.

The memory device of FIG. 2 is similar to that of FIG. 1 and like reference numerals in FIGS. 1 and 2 refer to like elements. The description of like elements is not repeated. Similar to in the memory device of FIG. 1, in the nonvolatile semiconductor memory device of FIG. 2, the read-out circuit (sense circuit portion) compares the read-out current flowing on the global bit line GBL or the bit line BL connected to a selected memory cell 10, with a reference current from a reference cell to determine whether the read-out data is "1" or "0".

However, the conventional nonvolatile semiconductor memory device of FIG. 2 includes three different reference cells 21 (RC1), 22 (RC2) and 23 (RC3), and a selector switch 24. Shown in FIG. 2, in a case in which the data held by each memory cell is four-level data, one of the three different reference cells: the reference cell 21 (RC1) supplying the reference current corresponding to the intermediate potential "¾", the reference cell 22 (RC2) supplying the reference current corresponding to the intermediate potential "½", and the reference cell 23 (RC3) supplying the reference current corresponding to the intermediate potential "¼" is selected by the selector switch 24, and a read-out current is compared with the reference current from the selected reference cell. Then, it is determined whether the potential held by the memory cell concerned is any of "1", "⅔", "⅓", or "0".

Moreover, similar to the composition of FIG. 1, in order to correct an unbalance of capacity of parasitic elements, the load capacitor CLD2 is provided between the cascode circuit 31 on the side of the memory cell 10 and the differential amplifier 30, and load capacitors CLD11, CLD12 and CLD13 are respectively provided in the current paths of the reference cells 21, 22 and 23.

The reference cells 21–23 are arranged at external positions different from the memory cell array where the respective memory cells 10 are arranged, in order to avoid the stress of a writing or erasing operation to the memory cells 10.

For this reason, in order to correct parasitic resistances and junction capacitances of the column selector 12 and the sector switches 13 and 14 existing on the side of the memory cell array, and parasitic components of the adjoining non-selected bit lines BL and the global bit lines GBL, and the data bus lines LDB, the load capacitors CLD11, CLD12, and CLD13 are connected to reference bus lines to which the reference cells 21, 22, and 23 are connected, respectively. By adding such load capacitors, the transient response characteristics of the reference bus line and the data bus line on the side of the memory cell are made equivalent, and a decrease in the sense time of the differential amplifier 30 may be achieved.

As described above, in the conventional nonvolatile semiconductor memory device of FIG. 2, the provision of the load capacitors CLD11, CLD12, and CLD13 in the current paths on the side of the reference cells artificially "balance" the capacity characteristics of the parasitic elements in the memory-cell-side current paths from the memory cells 10 to the differential amplifier 30.

However, the capacity of the parasitic elements in the current paths on the side of the memory cells varies with a distribution width caused by manufacturing tolerance. That is, the variations in the etching process of each wiring may cause the variation in the intervals of the adjoining wires, and the capacity of the parasitic elements having the intervals of the adjoining wires varies with a width in the distribution.

Moreover, variations in thickness of interlayer insulation films may cause variations in the intervals of upper and lower layer wirings. The capacity of the parasitic elements having the intervals of the adjoining wires varies with a certain width in the distribution. Furthermore, junction capacitance and an "ON" resistance may also vary with a certain width in the distribution and by variations of parameters of the transistors, such as a gate oxide film, and a concentration and depth of a diffusion layer.

In addition, a die size of a chip tends to be enlarged in connection with a larger capacity of a nonvolatile semiconductor memory device. Therefore, a difference in the on-chip parasitic capacitance in the same chip tends to be large. Simultaneously, the use of larger-diameter wafers may cause difference within the wafer surface to also become large.

Strictly speaking, the current path formed from the memory cells arranged in the sector through the bit lines having the hierarchical structure, and the reference-current path directly linked from the reference cells arranged in the external region have the different physical parameters in and around a position where the bit line is arranged, or the current path is formed.

For this reason, even if, in the design stage, the load capacitors CLD1, CLD2, and CLD3 which are suited to the characteristics of both the parasitic components are added, manufacturing variations and in-surface differences in the chip or wafer are different for each product. Thus, it is difficult to make the characteristics of the reference cells conform with the characteristics of the parasitic components in a conventional nonvolatile semiconductor memory device.

Figure 4A:
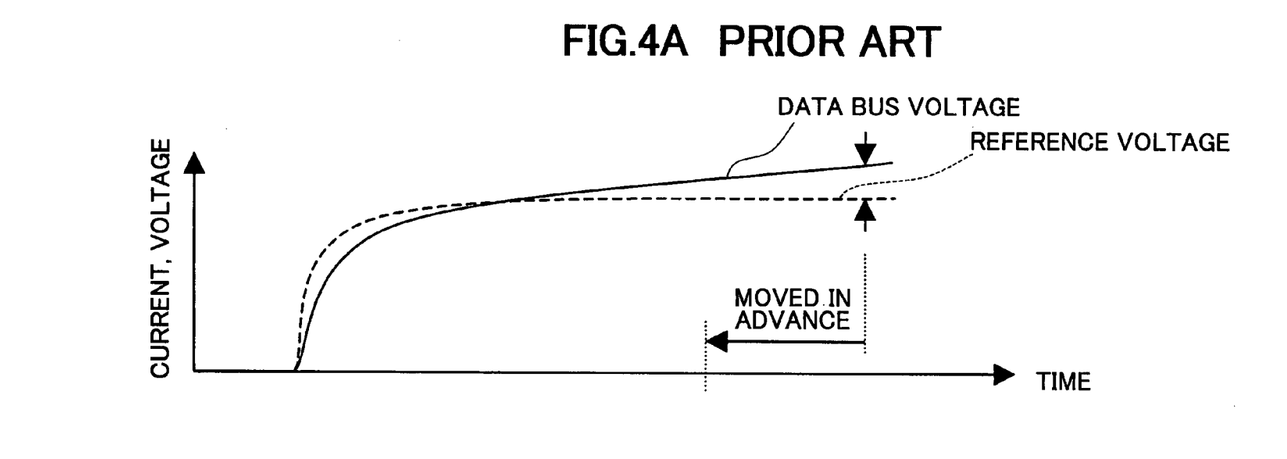
FIG. 4A is a waveform diagram for explaining a read-out operation of the conventional nonvolatile semiconductor memory device.

FIG. 4A is a waveform diagram for explaining read-out operation of the conventional nonvolatile semiconductor memory device. As shown in FIG. 4A, in the conventional nonvolatile semiconductor memory device, the potential change in the current path (data bus voltage) on the side of the memory cells and the potential change in the current path (reference voltage) on the side of the reference cells in the transient state of the read-out operation are not in agreement due to the propagation delay of the signal by the parasitic components.

When the timing of detection of the memory cell information is moved in advance before the time the potential change is completed within the predetermined limits, there is the possibility that the memory cell information is incorrectly detected. To avoid incorrect detection, it is necessary to delay the timing of detection of the memory cell information until the potential change is completed within the predetermined limits. This becomes a hindrance to performing the read-out operation at a higher speed.

SUMMARY OF THE INVENTION

An object of the present invention is to provide an improved nonvolatile semiconductor memory device in which the above-described problems are eliminated.

Another object of the present invention is to provide a nonvolatile semiconductor memory device having a read-out circuit that enables high-speed reading of memory cell information by eliminating the influences of parasitic components in a current path on a side of the memory cells.

In order to achieve the above-mentioned objects, the present invention provides a nonvolatile semiconductor memory device including a memory cell array in which memory cells each holding memory cell information are arrayed, reference cells which supply different reference currents respectively, and a read-out circuit, wherein, when reading the memory cell information from a selected one of the memory cells, the read-out circuit is brought into conduction to a first global bit line which is connected to a bit line of the selected memory cell, and brought into conduction to one of a plurality of second global bit lines respectively which are provided near the first global bit line and connected to bit lines of non-selected memory cells but not connected to the bit line of the selected memory cell, so that the memory cell information is determined by comparing a read-out current from the selected memory cell with each of the reference currents from the reference cells.

According to the nonvolatile semiconductor memory device of the present invention, the reference cells which are equivalent to "¾", "½", and "¼" are respectively connected to three global bit lines which are provided near the global bit line connected to the bit line of the selected memory cell, and are connected to the bit lines of only the non-selected memory cells. Each reference current and the read-out current of the selected memory cell are read out by setting the combination of the three global bit lines and the one global bit line connected to the bit line of the selected memory cell. The influence of the parasitic components in the current path on the side of the memory cells is eliminated, and high-speed reading operation of the memory cell information can be achieved.

Moreover, in order to achieve the above-mentioned objects, the present invention provides a nonvolatile semiconductor memory device comprising a memory cell array in which memory cells each holding memory cell information are arrayed, reference cells which supply different reference currents respectively, and a read-out circuit, wherein, when reading the memory cell information from a selected one of the memory cells, the read-out circuit is brought into conduction to with a first bit line connected to the selected memory cell, and brought into conduction with one of a plurality of second bit lines respectively which are provided near the first bit line and connected to non-selected memory cells but not connected to the selected memory cell, so that the memory cell information is determined by comparing a read-out current from the selected memory cell with each of the reference currents from the reference cells.

According to the nonvolatile semiconductor memory device of the present invention, the reference cells which are equivalent to "¾", "½", and "¼" are respectively connected to three bit lines provided near the bit line connected to the selected memory cell, and connected to only the non-selected memory cells. Each reference current and the read-out current of the selected memory cell are read out by setting the combination of the three bit lines connected to the non-selected memory cells and the one bit line connected to the selected memory cell. The influence of the parasitic components in the current path on the side of the memory cells is eliminated, and high-speed reading operation of the memory cell information can be achieved.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 5:
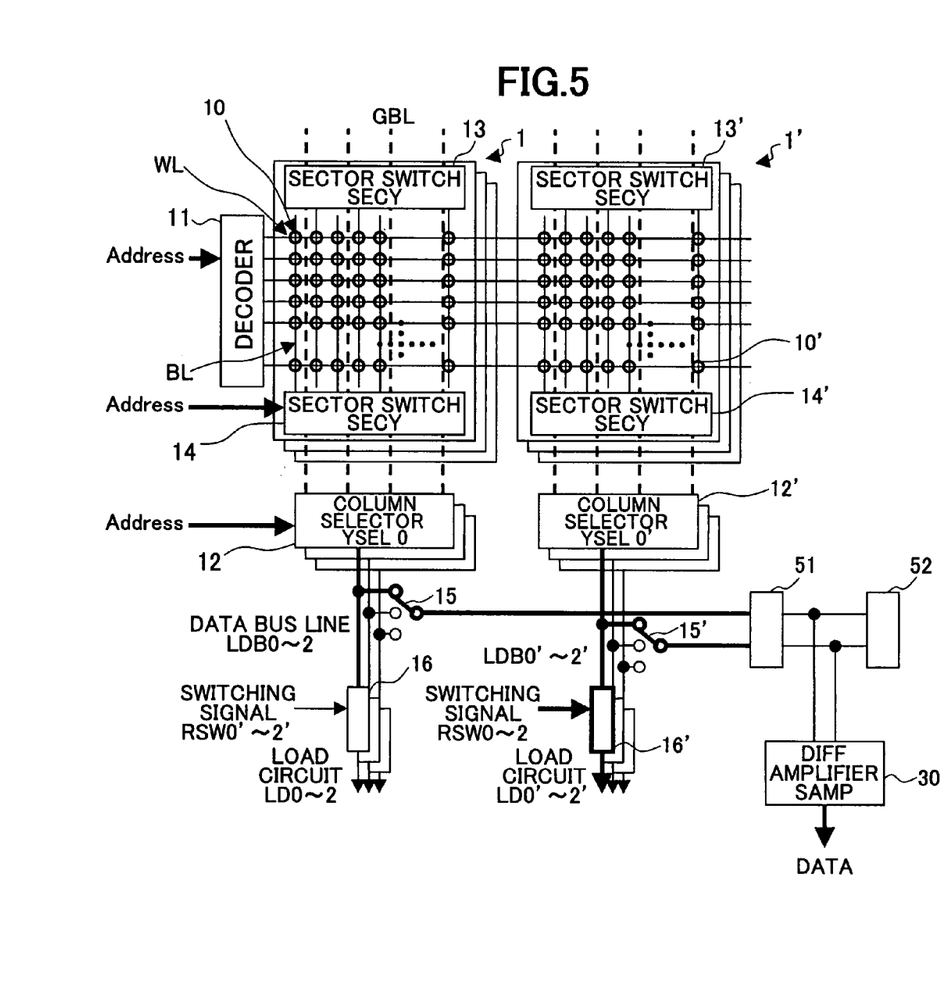
FIG. 5 is a schematic diagram showing a read-out circuit of a nonvolatile semiconductor memory device in which each memory cell holds four-level data in a first preferred embodiment of the present invention.

FIG. 5 shows the composition of a nonvolatile semiconductor memory device in a first preferred embodiment of the present invention. In the nonvolatile semiconductor memory device of FIG. 5, each memory cell holds four-level data, similar to the memory device of FIG. 2.

The nonvolatile semiconductor memory device of FIG. 5 comprises a first memory core portion 1, a second memory core portion 1' having a memory cell arrangement that is the same as that of the first memory core portion 1, and a read-out circuit.

The first memory core portion 1 includes a plurality of nonvolatile memory cells 10 (first memory cell array) which are connected in a 2-dimensional matrix formation by word lines WL and bit lines BL, a decoder 11 to which an address signal is inputted, a column selector (YSEL) 12, a sector switch (SECY) 13, and a sector switch (SECY) 14 to which the address signal is inputted.

The second memory core portion 1' includes a plurality of nonvolatile memory cells 10' (second memory cell array), a column selector 12', a sector switch 13', and a sector switch 14'.

In the nonvolatile semiconductor memory device of FIG. 5, the first and the second memory cell arrays 10, 10', the column selectors 12, 12', the sector switches 13, 13', and the sector switches 14, 14' have the three-layer hierarchical structure. The respective layers of each circuit component are designated by the suffixes 0, 1, and 2 attached to the reference character of the circuit component. For example, the first layers of the column selectors 12 and 12' are designated by YSEL0 and YSEL0'.

As described above, the nonvolatile semiconductor memory device of FIG. 5 includes the first memory cell array 1 in which the plurality of first memory cells 10 each hold four-level memory cell information. In the first memory cell array 1, each first memory cell 10 is provided to be selectable according to an address signal when reading the data. The nonvolatile semiconductor memory device of FIG. 5 further includes the second memory cell array 1', in which each of the plurality of second memory cells 10' is is provided not to be selected according to the address signal when reading the data.

Moreover, in the nonvolatile semiconductor memory device of FIG. 5, the read-out circuit is provided to determine whether the read data is "1" or "0" by comparing the read-out current flowing on the global bit line or bit line connected to the selected memory cell 10, with a reference current from a reference cell.

The read-out circuit of FIG. 5 includes an interface cascode circuit 51 connected with the column selector (YSEL0–2) 12 through a data bus line (LDB0–LDB2), a current-load cascode circuit 52 connected with a reference cell (not shown) through a reference bus line (LDB0'–LDB2'), and a differential amplifier (SAMP) 30 connected with the cascode circuit 51 and the cascode circuit 52.

Moreover, the read-out circuit of FIG. 5 includes a switch 15 provided in the current path between the column selector 12 and the cascode circuit 51, and a switch 15' provided in the current path between the column selector 12' and the cascode circuit 51.

Furthermore, the read-out circuit of FIG. 5 includes a load circuit (LD0–LD2) 16 connected with the current path from the column selector (YSEL0–2) 12, and a load circuit (LD0'–LD2') 16' connected with the current path from the column selector (YSEL0'–2') 12'. A selection signal (RSW0'–RSW2') is inputted to the load circuit (LD0–LD2) 16, and a selection signal (RSW0–RSW2) is inputted to the load circuit (LD0'–LD2') 16'.

During a read-out operation of the nonvolatile semiconductor memory device of FIG. 5, a word line WL is selected according to the inputted address signal, and the current according to the data which is held by the selected memory cell 10 flows on a corresponding bit line BL.

Any of the plurality of bit lines including this bit line BL is selected by the sector switches 13 and 14, and the plurality of bit lines including this bit line BL are connected to one of three global bit lines GBL0-GBL2.

Furthermore, one of the three global bit lines GBL0–GBL2 is selected by the column selector (YSEL0) 12 and brought into conduction with the data bus line LDB0. Simultaneously, the data bus line LDB0 is brought into conduction with the differential amplifier (SAMP) 30 by the switch 15. Although the data bus lines (LDB0–LDB2) are connected to the load circuits (LD0–LD2) 16 respectively, the conduction is cut away in each load circuit 16.

On the other hand, one of the three global bit lines GBL0'–GBL2' with which the bit lines of only the non-selected memory cells 10' are connected is selected by the column selector (YSEL0') 12', and brought into conduction with the data bus line LDB0'–LDB2'. The load circuits (LD0'–LD2') 16' are connected to the data bus lines (LDB0'–LDB2'), respectively.

In order to read the current flowing on the data bus line LDB0–LDB2, a reference current from each of three reference cells flows on the data bus lines LDB0'-LBD2', respectively. The reference currents are equivalent to "¼", "½", and "¾" respectively.

Moreover, similar to the data bus lines LDB0–LDB2, the data bus lines LDB0'–LDB2' are connected to the differential amplifier 30 through the switch 15'.

The data bus lines LDB0'–LDB2' are sequentially selected and brought into conduction with the differential amplifier 30 according to the switching selection operation of the switch 15', and the differential amplifier 30 compares the read-out current from the data bus line LDB0 with each of the reference currents from the three reference cells to determine the value of the read-out data of the selected memory cell 10.

On the other hand, when reading the data on the side of the data bus line LDB0'–LDB2', the load circuit LD0–LD2 is connected with the data bus line LDB0–LDB2, and a similar read-out operation is performed according to the switching selection operation of the switch 15'.

Figure 4B:
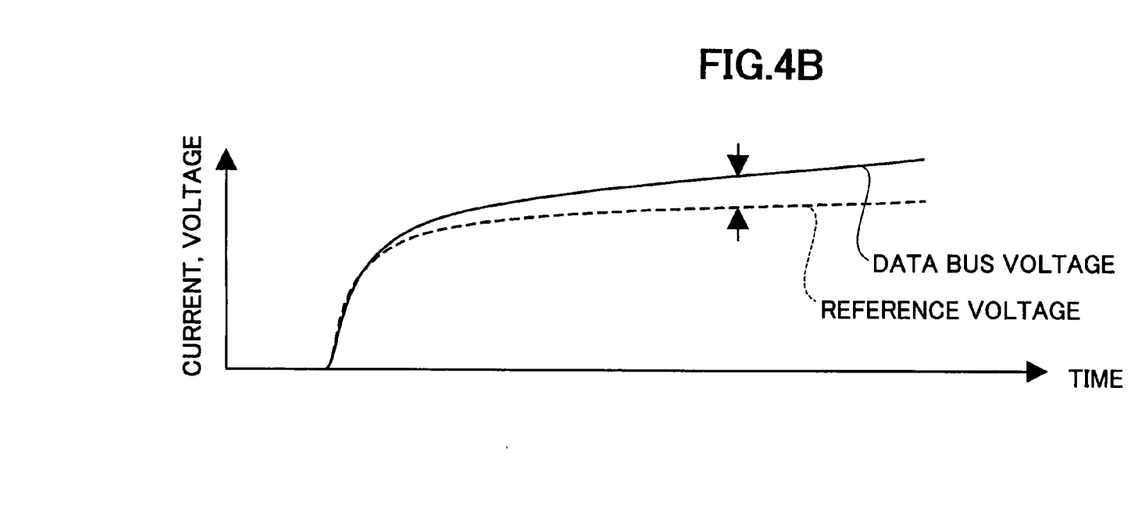
FIG. 4B is a waveform diagram for explaining a read-out operation of the nonvolatile semiconductor memory device according to the present invention.

FIG. 4B is a waveform diagram for explaining operation of the data bus lines of a nonvolatile semiconductor memory device according to the present invention.

As described above with respect to FIG. 5, in the nonvolatile semiconductor memory device of this embodiment, the data bus line which is selected by the column selector 12' from the three global bit lines, which are essentially physically identical to the global bit line connected to the bit line of the selected memory cell 10, is conducted to each of the three reference cells which are equivalent to "¾", "½", and "¼" respectively, and the read-out operation is performed with the pair of the data bus line on the side of the selected memory cell 10 and the data bus line on the side of the non-selected memory cell 10'.

Since the junction capacitance of the sector switches 13' and 14' and the column selector 12', and the parasitic capacitance with the adjoining non-selected wiring, etc., are contained in the three data bus lines, the data bus line on the side of the non-selected memory cell 10' is essentially the same as the data bus line on the side of the memory cell 10 being read.

Since a transient change in the data bus line on the side of the memory cells in the read-out operation of the three reference bus lines is also the same, it is possible to advance the timing of detection of the memory cell information, as shown in FIG. 4B.

Moreover, the neighboring global bit lines are essentially physically identical to the global bit line on the side of the first memory cell array. Thus, when the influence of noise, etc. occurs in the global bit line on the side of the first memory cell array, an equivalent influence also occurs in the global bit lines on the side of the second memory cell array. Therefore, such influence in the first memory cell array and in the second memory cell array are cancelled by each other.

Therefore, the time from the beginning of the read-out operation to the end of the read-out operation is decreased by the nonvolatile semiconductor memory device of the present embodiment, making it possible to decrease the period of the entire read-out operation.

Figure 6:
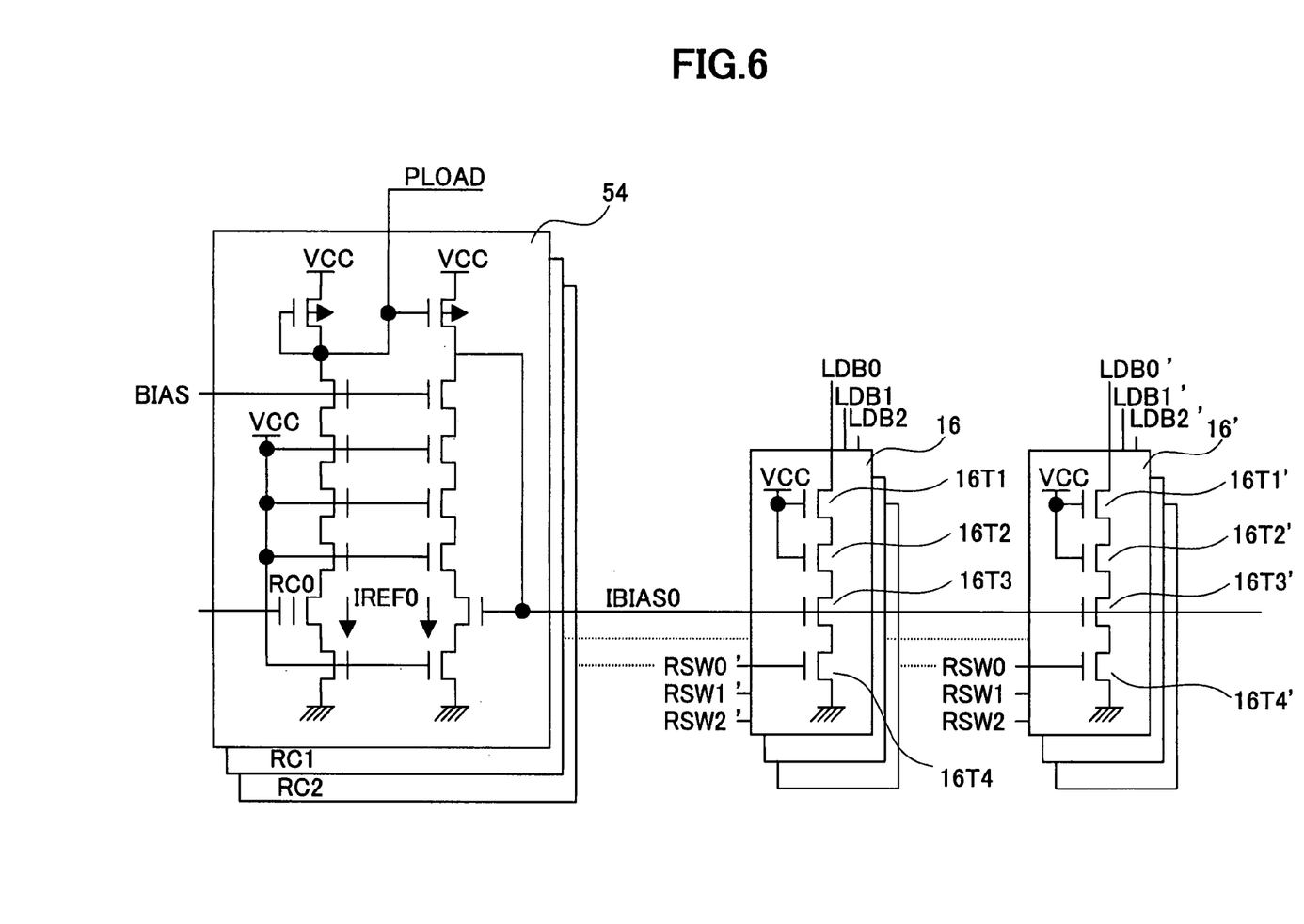
FIG. 6 is a circuit diagram showing a load circuit in the read-out circuit of FIG. 5.

FIG. 6 shows an example of the load circuit in the read-out circuit of FIG. 5.

As shown in FIG. 6, a bias voltage BIAS and the load voltage PLOAD are inputted to a reference cell circuit 54. In the reference cell circuit 54, for example, a reference current IREF0, which is equivalent to the memory cell potential "¼", is passed from the reference cell RC0, and converted into a corresponding voltage signal.

The output voltage IBIAS0 is conducted to the load circuit (LD0) 16 and the load circuit (LD0') 16', which are connected to the data bus line LDB0 and the data bus line LDB0', respectively, and the reference current IREF0 can be passed on the data bus lines LDB0 and LDB0'.

The load circuit (LD0) 16 includes a transistor 16T1 to which a power supply voltage Vcc is inputted and having a source terminal connected to the data bus line LDB0, a transistor 16T2 to which the power supply voltage Vcc is inputted, a transistor 16T3 to which the voltage IBIAS0 is inputted, and a transistor 16T4 to which the selection signal RSW0' is inputted and having a drain terminal grounded.

The load circuit (LD0') 16' includes a transistor 16T1' to which the power supply voltage Vcc is inputted and having a source terminal connected to the data bus line LDB0', a transistor 16T2' to which the power supply voltage Vcc is inputted, a transistor 16T3' to which the voltage IBIAS0 is inputted, and a transistor 16T4' to which the selection signal RSW0 is inputted and having drain terminal grounded.

Similarly, the output voltage IBIAS1 from the reference cell circuit 54 containing the reference cell RC1, which supplies the reference current equivalent to the memory cell potential "½", is conducted to the load circuit (LD1) 16 and the load circuit (LD1') 16', which are connected to the data bus line LDB1 and the data bus line LDB1', respectively, and the reference current IREF1 can be passed on the data bus lines LDB1 and LDB1'.

Similarly, the output voltage IBIAS2 from the reference cell circuit 54 containing the reference cell RC2, which supplies the reference current equivalent to the memory cell potential "¾", is conducted to the load circuit (LD2) 16 and the load circuit (LD2') 16' which are connected to the data bus line LDB2 and the data bus line LDB2', respectively, and the reference current IREF2 can be passed on the data bus lines LDB2 and LDB2'.

With the load circuit 16 and the load circuit 16' being provided as described above, the reference currents, which are equivalent to the memory cell potentials "¼", "½", and "¾" can be passed on the data bus lines, respectively.

In an actual read-out operation in the nonvolatile semiconductor memory device of FIG. 5, when reading the current flowing on the data bus lines LDB0–LDB2, the selection signal RSW0–RSW2 is set in an ON state, the selection signal RSW0'–RSW2' is set in an OFF state, and each of the reference currents is passed on the data bus lines LDB0'–LDB2'.

On the contrary, when reading the current flowing on the data bus lines LDB0'–LDB2', the selection signal RSW0'–RSW2' is set in an ON state, the selection signal RSW0–RSW2 is set in an OFF state, and each of the reference currents is passed on the data bus lines LDB0–LDB2.

Figure 7:
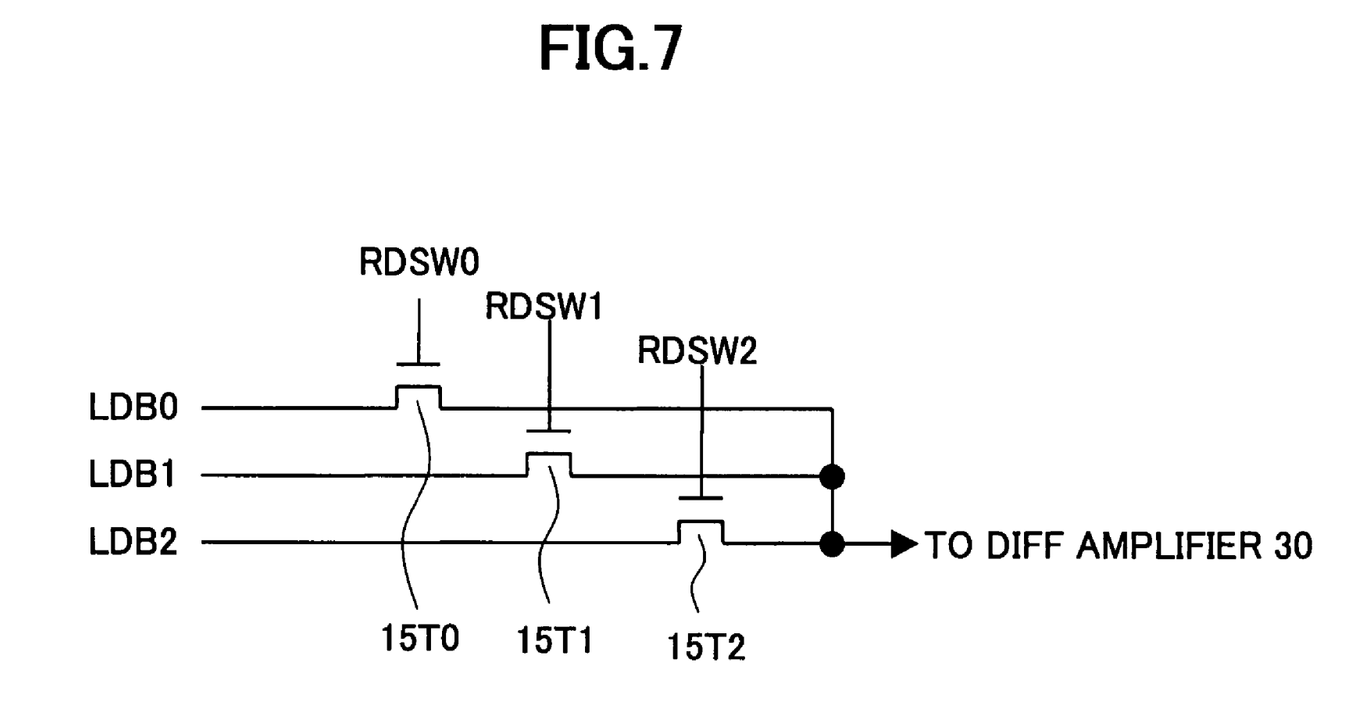
FIG. 7 is a circuit diagram showing a selector switch between a differential amplifier and a data bus line in the read-out circuit of FIG. 5.

FIG. 7 shows an example of the selector switch 15 between the differential amplifier 30 and the data bus line in the read-out circuit of FIG. 5.

The selector switch 15 of FIG. 7 includes a transistor 15T0, a transistor 15T1, and the transistor 15T2. A signal RDSW0 is inputted to the gate terminal of the transistor 15T0, the source terminal of the transistor 15T0 is connected to the data bus line LDB0, and the drain terminal thereof is connected to an input of the differential amplifier 30. A signal RDSW1 is inputted to the gate terminal of the transistor 15T1, the source terminal of the transistor15T1 is connected to the data bus line LDB1, and the drain terminal thereof is connected to the input of the differential amplifier 30. A signal RDSW2 is inputted to the gate terminal of the transistor 15T2, the source terminal of the transistor 15T2 is connected to the data bus line LDB2, and the drain terminal thereof is connected to the input of the differential amplifier 30.

When the current flowing on the data bus line LDB0–LDB2 is read out, one of the selection signals RDSW0–RDSW2 inputted to the switch 15 is set in an ON state. One of the data bus lines to which the three transistors 15T0–15T2 are respectively connected is selected according to this selection signal, and the selected data bus line is set in an ON state, so that it is brought into conduction with the differential amplifier 30.

On the other hand, when the current flowing on the data bus line LDB0–LDB2 is used as the reference current, one of the selection signals RDSW0–RDSW2 inputted to the switch 15 is sequentially set in ON state. Each of the data bus lines to which the three transistors 15T0–15T2 are respectively connected is sequentially conducted to the differential amplifier 30 according to this selection signal, so that the read-out operation on the side of the data bus line LDB0'–LDB2' is performed.

The composition and operation of the selector switch 15 have been explained with reference to FIG. 7. The selector switch 15' in the read-out circuit of FIG. 5 can also be constituted in the same manner as the selector switch 15, and the selector switch 15' can operate according to the selection signals RDSW0'–RDSW2' inputted thereto in the same manner as the selector switch 15 operates.

Figure 9:
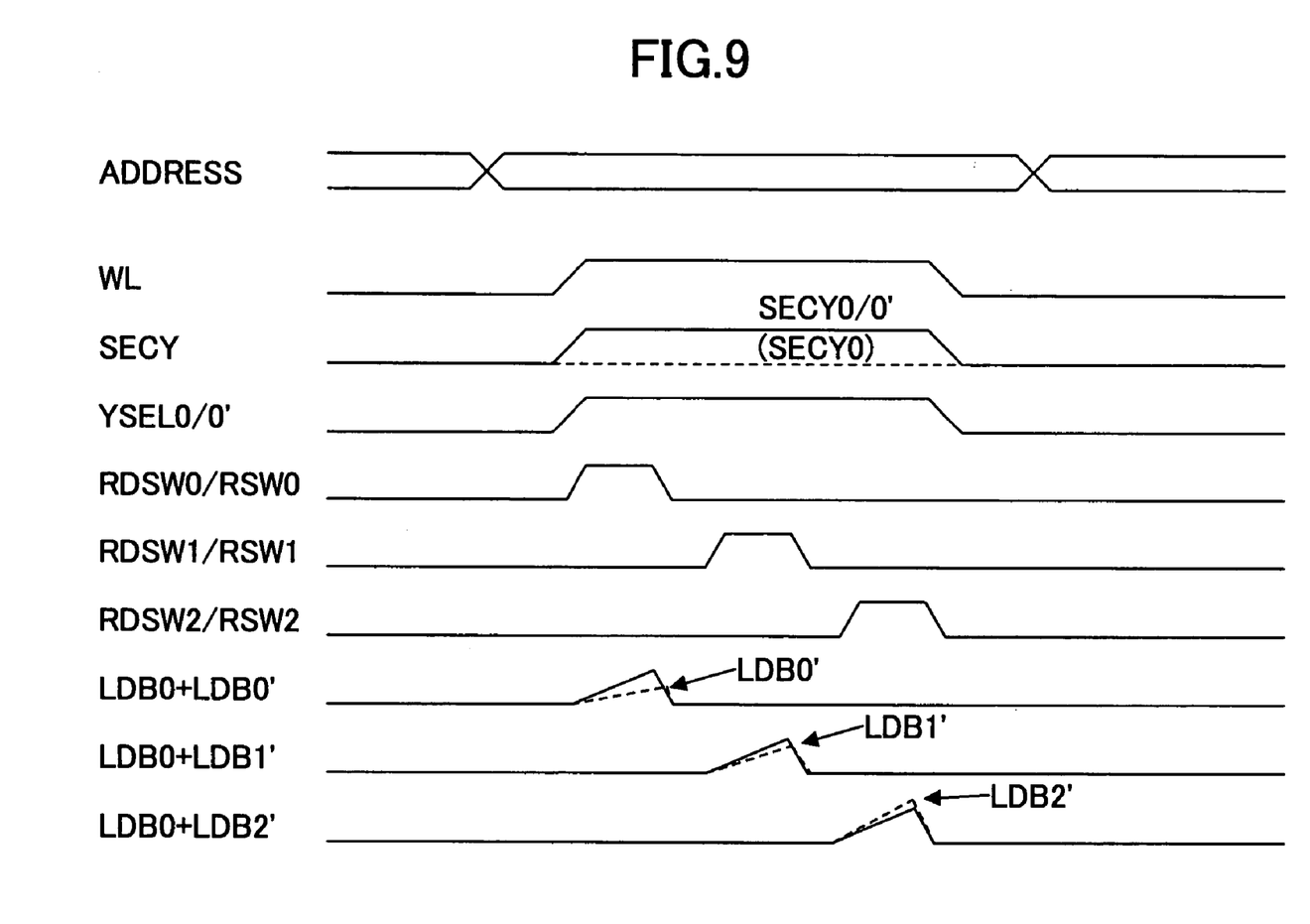
FIG. 9 is a timing chart for explaining operation of the selector switch of FIG. 7.

FIG. 9 is a timing chart for explaining operation of the selector switch of FIG. 7.

In the example of FIG. 9, a situation in which the current flowing on the data bus line LDB0–LDB2 is read out is assumed. The word line WL is selected in accordance with the inputted address signal (Address), and the current according to the data held by the selected memory cell 10 flows on the bit line BL. The plurality of bit lines containing this bit line BL are selected by the sector switch SECY, and the selected bit lines are connected to the global bit line GBL0.

Furthermore, the three global bit lines GBL0–GBL2 including this global bit line GBL0 are selected by the column selector (YSEL0) 12, and they are brought into conduction with the data bus line LDB0. Simultaneously, the data bus line LDB0 is brought into conduction with the differential amplifier 30 by the selector switch 15. Although the data bus lines (LDB0–LDB2) are connected also to the load circuits (LD0–LD2) 16, the conduction is cut away in each of the load circuits 16.

On the other hand, the three global bit lines GBL0'–GBL2' to which the bit lines of the non-selected memory cells 10' are connected are selected by the column selector (YSEL0') 12', and they are brought into conduction with the data bus lines LDB0'–LDB2'. The load circuits (LD0'–LD2') 16' are connected to these data bus lines LDB0'–LDB2'. They are provided so that each of the reference currents from the three reference cells RC0, RC1, and RC2, which are equivalent to "¼", "½", and "¾", flow on the data bus lines LDB0'–LDB2', respectively.

At this time, each of the selection signals RDSW0–RDSW2 inputted to the selector switch 15' is sequentially set in an ON state, as shown in FIG. 9. Each of the data bus lines LDB0'–LDB2' is sequentially selected by the switching operation of the selector switch 15' according to the selection signals RDSW0–RDSW2, and the selected data bus line is brought into conduction with the differential amplifier 30. Thus, the read-out operation on the side of the data bus lines LDB0–LDB2 is performed.

In the nonvolatile semiconductor memory device of the above-mentioned embodiment, the memory cells are connected to the plurality of bit lines, and the plurality of bit lines have the hierarchical structure such that some of the plurality of bit lines connected to the global bit line are selected by the sector switches 13 and 14.

However, the present invention is not limited to the composition of the above-mentioned embodiment. The nonvolatile semiconductor memory device of the present invention may be configured so that the bit lines to which the memory cells are connected are connected directly to the column selector 12, and the bit lines do not have the hierarchical structure. Even when such a composition is applied, the advantageous effects of the invention are the same as those of the above-mentioned embodiment.

Figure 8:
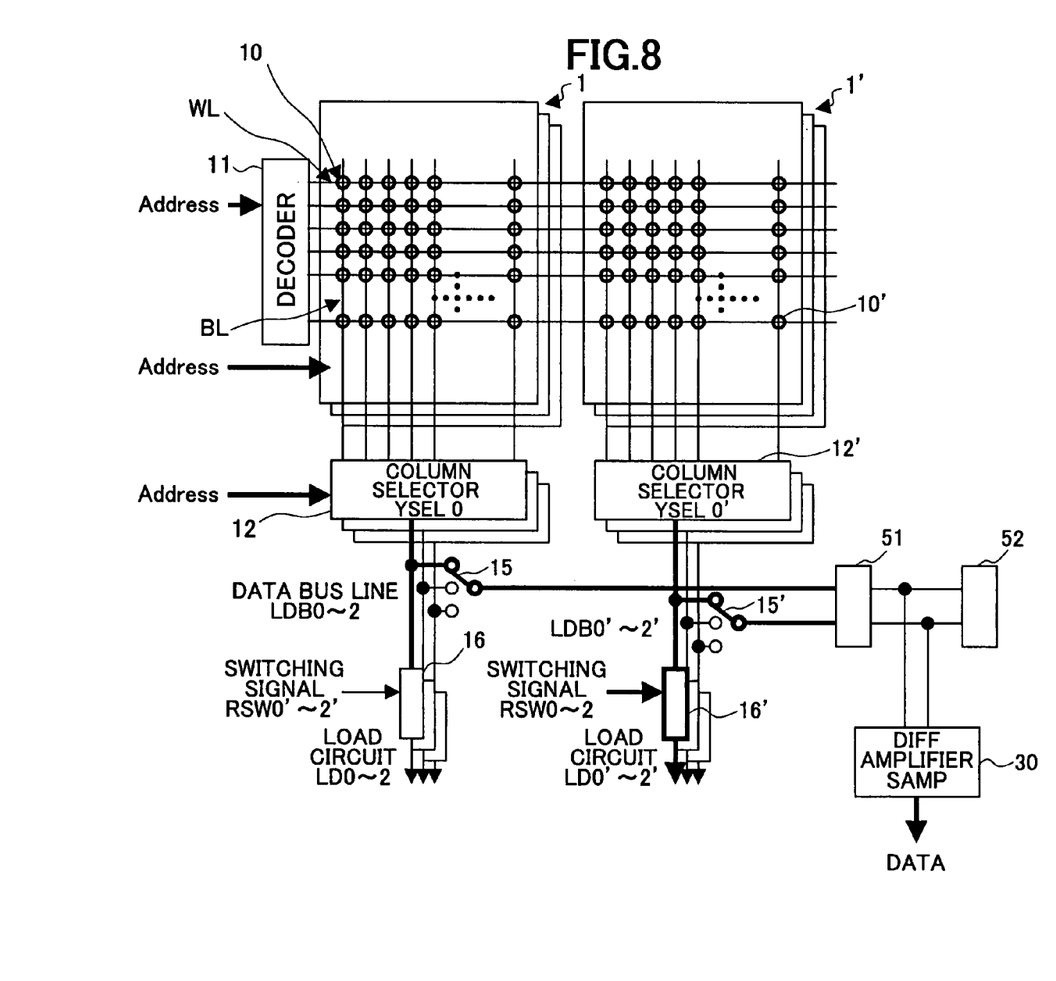
FIG. 8 is a schematic diagram showing a read-out circuit of a nonvolatile semiconductor memory device in which each memory cell holds four-level data in a second preferred embodiment of the present invention.

FIG. 8 shows the composition of a nonvolatile semiconductor memory device according to a second preferred embodiment of the present invention.

In the nonvolatile semiconductor memory device of FIG. 8, each memory cell holds four-level data, similar to the composition of FIG. 5.

In the embodiment of FIG. 8, the bit lines BL to which the memory cells are connected are connected directly to the column selectors (YSEL0–2) 12 and the column selectors (YSEL0'–2') 12', and the bit lines BL do not have a hierarchical structure.

The composition of FIG. 8 is essentially the same as the composition of FIG. 5 except for the structure of the first memory core portion 1 and the second memory core portion 1'. In FIG. 8, the elements which are the same as corresponding elements in FIG. 5 are designated by the same reference numerals, and a description thereof will be omitted.

Even when the nonvolatile semiconductor memory device of FIG. 8 is applied, the advantageous effects which are the same as those of the nonvolatile semiconductor memory device of FIG. 5 can be acquired.

In the nonvolatile semiconductor memory device of FIG. 8, when reading the four-level data from the selected memory cell 10, each reference current and the current of the selected memory cell 10 are read out by setting the combination of the three bit lines connected to the non-selected memory cells 10' and the one bit line connected to the selected memory cell 10.

As described in the foregoing, according to the nonvolatile semiconductor memory device of the present invention, in the reading operation, the combination of the global bit line connected to the selected memory cell, and the three global bit lines located near that global bit line and connected to the non-selected memory cells is set, the loads connected to the data bus lines are made ideally equivalent. The parasitic capacitance at the connection of the global bit line and the data bus line is minimized. The memory cell information can be determined in the initial transient response period of the reading operation, and high-speed reading operation of the memory cell information can therefore be achieved.

Moreover, the neighboring global bit lines are essentially physically identical to the global bit line on the side of the first memory cell array. Thus, when influence of noise in the global bit line on the first memory cell array arises, an equivalent influence arises also in the global bit lines on the side of the second memory cell array, so that the influence in the first memory cell array and the influence in the second memory cell array are cancelled by each other. It is therefore possible by the present invention to increase the reliability of reading the memory cell information.

The present invention is not limited to the above-described embodiments, and variations and modifications may be made without departing from the scope of the present invention.

What is claimed is:

1. A nonvolatile semiconductor memory device comprising:
   a plurality of memory cells holding memory cell information;
   a plurality of reference cells supplying different reference currents respectively; and
   a read-out circuit which is coupled to a first bit line connected to a selected memory cell and coupled to one of a plurality of second bit lines connected to non-selected multi-value memory cells.

2. The nonvolatile semiconductor memory device according to claim 1, wherein the plurality of memory cells include a first memory cell which holds a fourlevel data and is provided to be selectable according to an address signal, and a second memory cell which is provided not to be selected according to the address signal.

3. The nonvolatile semiconductor memory device according to claim 1, wherein the reference cells comprise three reference cells which supply different reference currents respectively, and the plurality of second bit lines comprise three bit lines provided near the first bit line.

4. The nonvolatile semiconductor memory device according to claim 1 further comprising a decoder circuit selecting at least one of the plurality of multi-value nonvolatile memory cells in response to an address signal.

5. The nonvolatile semiconductor memory device according to claim 1 further comprising a sector switch circuit coupled to the plurality of bit lines.

6. The nonvolatile semiconductor memory device according to claim 1 further comprising a column switch circuit coupling the selected bit line with a first data bus line.

7. A nonvolatile semiconductor memory device comprising:
   a plurality of memory cells holding multi-value memory cell information;
   a plurality of bit lines connected to the plurality of multi-value memory cells, the plurality of bit lines including a first bit line connected to a selected one of the plurality of memory cells and a plurality of second bit lines connected to non-selected memory cells;
   a plurality of reference cells supplying different reference currents respectively; and
   a read-out circuit wherein, when reading the memory cell information, the read-out circuit is coupled to the first bit line connected to the selected memory cell and coupled to one of the plurality of reference cells through one of the plurality of second bit lines connected to the non-selected memory cells.

8. A semiconductor device comprising:
   a plurality of memory cells holding multi-value memory cell information;
   a plurality of bit lines connected to the plurality of memory cells, the plurality of bit lines including a first bit line connected to a selected one of the plurality of memory cells
   a plurality of reference cells supplying different reference currents respectively; and
   a read-out circuit connected to the plurality of reference cells, wherein when reading the memory cell information from the selected one of the memory cells, the read-out circuit is coupled to the first bit line connected to the selected memory cell, and is coupled to one of the plurality of reference cells through one of the plurality of second bit lines respectively, are provided near the first bit line and connected to the non-selected memory cells but not connected to the selected memory cell, so that the memory cell information is determined by comparing a read-out current from the selected memory cell with each of the referenc currens from the reference cells.

9. The semiconductor device according to claim 8, wherein the sense circuit compares the data sequentially.

10. The semiconductor device according to claim 8, wherein the plurality of multi-value nonvolatile memory cells are divided into a first memory array and a second memory array, the first data bus line is provided in the first memory array, and the plurality of second data bus lines are provided in the second memory array.

11. A semiconductor device comprising:
    a plurality of multi-value nonvolatile memory cells;
    a plurality of bit lines coupled to the plurality of multi-value nonvolatile memory cells;
    a plurality of word lines coupled to the plurality of multi-value nonvolatile memory cells;

a decoder circuit selecting at least one of the plurality of multi-value nonvolatile memory cells;

a plurality of data bus lines coupled to the plurality of bit lines;

a plurality of reference cells respectively supply different reference currents or voltages;

a first data bus line transferrinf data from the selected nonvolatile memory cell selected by the decoder circuit;

a plurality of second data line coupled to non-selected memory cells, transferring each of the reference currents or voltages from the plurality of reference cells; and a sense circuit coupled to the first data bus line and the plurality of second data bus lines, wherein the sense circuit compares the data on the first data bus line with each of the reference currents or voltages received from the plurality of reference cells through one of the plurality of second data bus lines in order to determine a value of the selected multi-value nonvolatile memory cell.

12. A semiconductor device comprising:

a plurality of multi-value nonvolatile memory cells;

a plurality of bit lines coupled to the plurality of multi-value nonvolatile memory cells;

a plurality of word lines coupled to the plurality of multi-value nonvolatile memory cells;

a decoder circuit selecting one from among the plurality of multi-value nonvolatile memory cells;

a plurality of reference cells respectively supply different reference currents or voltages;

a first data bus line coupled to the selected multi-value nonvolatile memory cell;

a plurality of second data bus lines coupled to non-selected multi-value nonvolatile memory cells and coupled to the plurality of reference cells; and a sense circuit coupled to the first data bus line and the plurality of second data bus lines, wherein the sense circuit compares the data on the first data bus line with the data on one of the plurality of second data bus lines in order to determine a value of the selected multi-value nonvolatile memory cell.

13. The semiconductor device according to claim 12, wherein the sense circuit compares the data on the first data bus line with each of the data on the plurality of second data bus lines sequentially.

14. The semiconductor device according to claim 12, wherein the plurality of multi-value nonvolatile memory cells are divided into a first memory array and a second memory array, the first data bus line is provided in the first memory array, and the plurality of second data bus lines are provided in the second memory array.

15. The semiconductor device according to claim 12 further comprising a plurality of global bit lines coupled between the plurality of bit lines and the plurality of second data bus lines.

16. The semiconductor device according to claim 12 further comprising a first load circuit coupled to the first data bus line and a second load circuit coupled to onr of the plurality of second data bus lines.

17. The semiconductor device according to claim 16 wherein the first load circuit is deactivated and the second load circuit is activated when the selected nonvolatile memory cell is coupled to the first data bus line.

18. A semiconductor device comprising:

a plurality of nonvolatile memory cells each of which holds multi-level data;

a plurality of bit lines coupled to the plurality of nonvolatile memory cells;

a plurality of reference cells supplying different reference currents or voltages respectively; and a read-out circuit coupled to receive (i) data from a selected nonvolatile memory cell through a first bit line of the plurality of bit lines, and (ii) one of the reference currents or voltages through one of a plurality of second bit lines connected to non-selected memory cells.

* * * * *